United States Patent
Naji

(10) Patent No.: US 6,452,823 B1
(45) Date of Patent: Sep. 17, 2002

(54) NON-VOLATILE MAGNETIC CACHE MEMORY AND METHOD OF USE

(75) Inventor: Peter K. Naji, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 60 days.

(21) Appl. No.: 09/774,983

(22) Filed: Jan. 31, 2001

(51) Int. Cl.$^7$ ................................. G11C 15/02
(52) U.S. Cl. ............................ 365/50; 365/158
(58) Field of Search ................. 365/50, 158, 171, 365/173, 49

(56) References Cited

U.S. PATENT DOCUMENTS

| | | |
|---|---|---|
| 5,475,825 A | 12/1995 | Yonezawa et al. |
| 5,905,996 A | 5/1999 | Pawlowski |
| 5,943,284 A * | 8/1999 | Mizuno et al. ........ 365/230.03 |
| 6,145,055 A * | 11/2000 | Fujimoto ................... 711/128 |
| 6,169,687 B1 | 1/2001 | Johnson |
| 6,389,524 B1 * | 5/2002 | Sato ........................... 711/212 |

* cited by examiner

Primary Examiner—Richard Elms
Assistant Examiner—Anh Phung
(74) Attorney, Agent, or Firm—William E. Koch

(57) ABSTRACT

A non-volatile, bistable magnetic tunnel junction cache memory including a cache tag array and a cache data array. The cache tag array includes non-volatile magnetic memory tag cells arranged in rows and columns. Each row of the tag array includes a word line and a digit line associated with each tag cell in the row. The cache data array includes non-volatile magnetic memory data cells arranged in rows and columns. The rows of the data array correspond with the rows of the tag array and each row of the data array is magnetically associated with the word line and the digit line associated with each corresponding row of the tag array.

31 Claims, 4 Drawing Sheets

US 6,452,823 B1

NON-VOLATILE MAGNETIC CACHE MEMORY AND METHOD OF USE

FIELD OF THE INVENTION

This invention relates to magnetic memories, and more specifically to magnetic memories that are non-volatile and used as cache memories.

BACKGROUND OF THE INVENTION

Analysis of a large number of typical computer programs and the like has shown that the reference to the main memory at any given interval of time tends to be confined within a few areas of the main memory. This is known as the property of "locality of reference".

In general, memory references to instructions tend to be highly localized whereas references to data are not as localized. If most references, instructions or data, are placed in a fast and small memory, the average general memory access time can be reduced, thus, reducing the total execution time of the program. Such a small and fast memory is generally known as a cache memory.

The idea behind a cache memory is to keep the most frequently accessed instructions and data in a fast cache memory. As a result, the average memory access time will approach the access time of the cache memory. Although the cache memory is a small fraction of the size of the main memory, a large portion of memory requests will be found in the cache memory, due to the locality of reference property of instructions and/or data.

When the central processing unit (CPU) of the computer needs to access memory, the cache is interrogated. If the word is found in the cache memory, it is read from a fast memory portion of the cache memory. If the word is not found in the cache memory, the slower main memory is accessed to read the word. A block of words, associated with the word just accessed from the main memory, is then transferred from the main memory to the cache memory. The block size could be one or several words adjacent to the word just accessed. In this way, some data is transferred to the cache memory so that future references to the cache memory can find the required word or words in the cache memory.

When the CPU finds a word in the cache memory it is known as a "hit" and if the word is not in the cache but is present in the main memory it is known as a "miss". The "hit ratio" is calculated by dividing the number of hits by the number of hits plus the number of misses. A hit ratio of 0.9 or better is desired.

The average memory access time of a CPU can be improved by the use of a cache memory. If the hit ratio is high enough, the average access time will approach the access time of the cache memory. The most important characteristic of a cache memory is that it have super-fast access time. Therefore, extremely small time, or no time at all, must be spent when searching for a word in the cache memory.

In the prior art, SRAMs are used as cache memories because they are fast. However, SRAMs are volatile and, hence, each time the computer is shut-down the cache memory loses all of the information. These volatile SRAM cache memories have a big problem known as "Cache Initialization". Typically, upon power-up an initialization condition is forced upon the cache memory, such that it has the effect of forcing misses from the cache until it fills with valid data or instructions such that the property of "locality of reference" starts to work. This initialization can require relatively large amounts of time after each power-up.

The present invention contemplates non-volatile magnetic cache memories, and the fabrication thereof, to overcome many of the above described problems.

The present invention also contemplates non-volatile magnetic cache memories with new and novel access and readout structure to overcome many of the above described problems.

The present invention further contemplates non-volatile magnetic cache memories constructed for additional speed in search and readout modes to overcome many of the above described problems.

BRIEF DESCRIPTION OF THE DRAWINGS

Referring to the drawings.

DESCRIPTION OF THE PREFERRED EMBODIMENT

Figure 1:
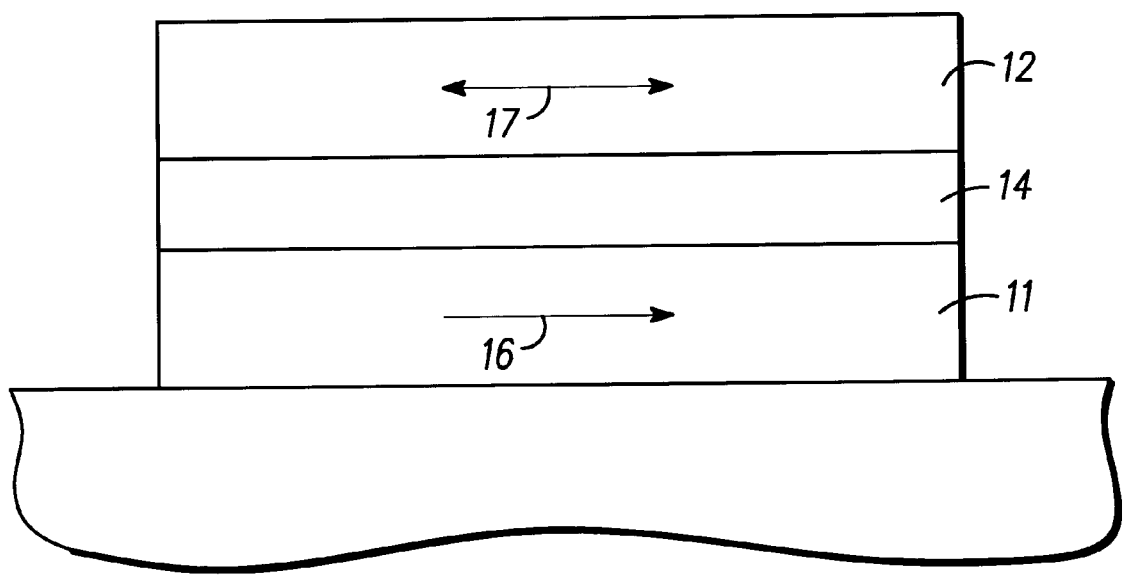
FIG. 1 is a simplified sectional view of a MTJ non-volatile magnetic memory cell.

Turning now to the figures and specifically to FIG. 1, a simplified sectional view of a magnetic tunneling junction (MTJ) cell 10, generally as used in the present disclosure, is illustrated to briefly describe the operation of this type of MTJ cell. MTJ cell 10 includes a pair of layers 11 and 12 of magnetic material. Layers 11 and 12 have a layer 14 of tunnel barrier material sandwiched therebetween. As is known in the art, layers 11 and 12 are each generally formed of a plurality of layers of magnetic material, such as cobalt (Co), nickel (Ni), iron (Fe), and the like. Layer 14 is formed of some nonconductive material such as aluminum oxide, aluminum nitride, or the like.

One of the layers of magnetic material, layer 11 in this description, has a larger switching field so that its magnetic vector, represented by arrow 16, hereinafter vector 16, is always pointed in the same direction (pinned) when the applied magnetic field is less than its switching field. The magnetic vector of layer 12, represented by arrow 17, hereinafter vector 17, has a smaller switching field and is free, but constrained by the physical size of layer 12, to point in either of two directions when the applied magnetic field is larger than its switching field. Cell 10 is used by connecting it in a circuit such that electricity flows vertically through cell 10 from one of the layers 11 or 12 to the other. Cell 10 can be electrically represented as a resistor and the size of the resistance depends upon the orientation of magnetic vectors 16 and 17. As is understood by those skilled in the art, cell 10 has a relatively high resistance when magnetic vectors 16 and 17 are misaligned (point in opposite directions) and a relatively low resistance when magnetic vectors 16 and 17 are aligned.

Additional information as to the fabrication and operation of MTJ cells can be found in U.S. Pat. No. 5,702,831, entitled "Multi-Layer Magnetic Tunneling Junction Memory Cells", issued Mar. 31, 1998, and incorporated herein by reference.

Figure 2:
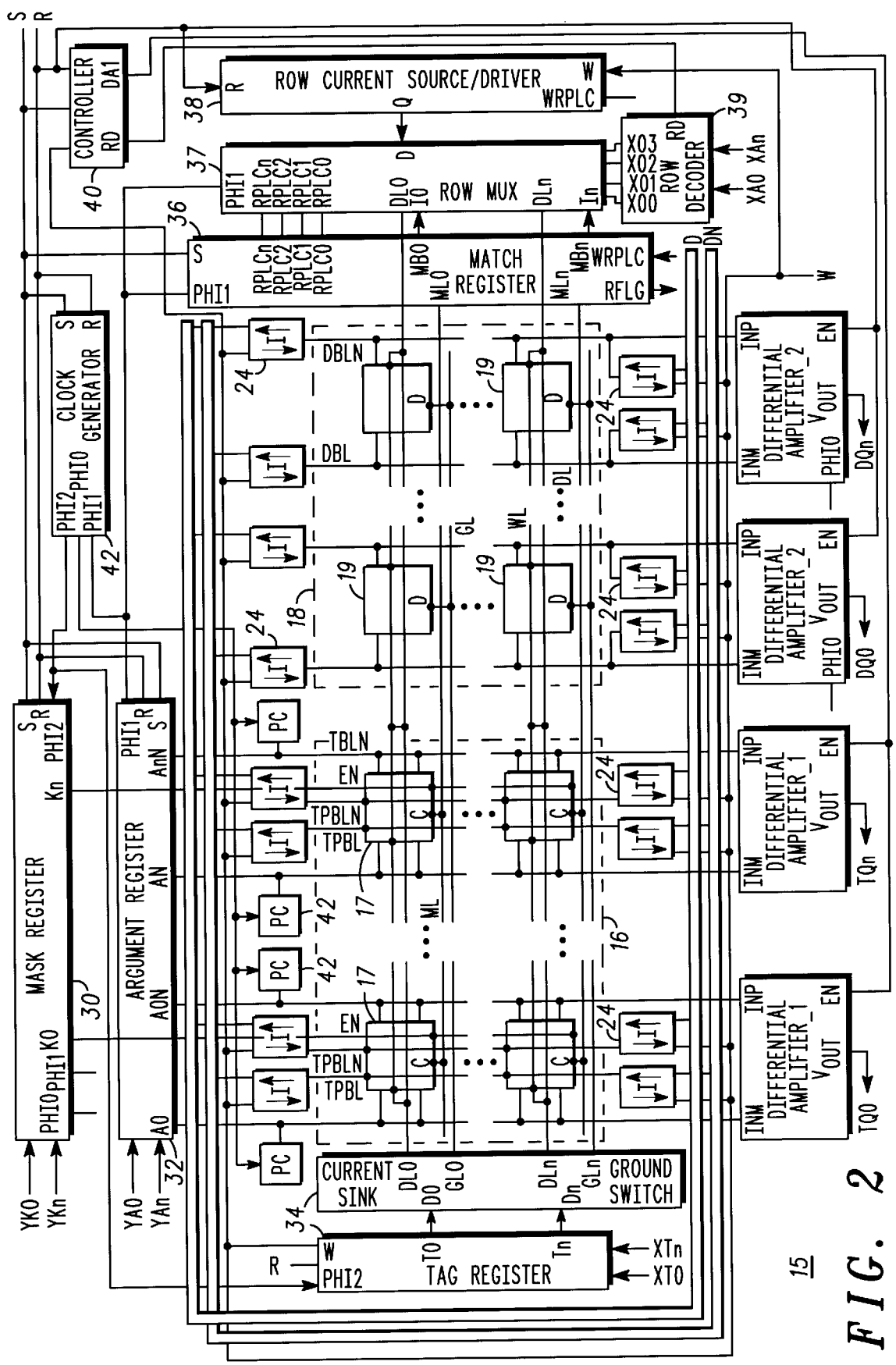
FIG. 2 is a block diagram of a non-volatile magnetic cache memory in accordance with the present invention.

Turning to FIG. 2, a block diagram is illustrated of a non-volatile magnetic cache memory 15, in accordance with the present invention. Cache memory 15 includes a cache tag array 16 of non-volatile magnetic memory tag cells 17 arranged in n rows and m columns (where n and m can be any whole number). In this description n rows, 0 through n, are illustrated. Each tag cell 17 includes a differentially connected pair of magnetic tunnel junctions and programming and detection circuitry connect the tunnel junctions together. Cache memory 15 also includes a cache data array 18 of non-volatile magnetic memory data cells 19 arranged in rows and columns. The rows of cache data array 18 correspond with the rows of cache tag array 16, as will be understood from the following description. In the art, the address of a selected word is known as the "tag" or "tag word" and the content is known as "data" or "data word". Thus, cache memory 15 stores both the address and the data in a common based memory. Further, as will be described in more detail presently, the tag and data for a selected word are stored in a common row.

Figure 3:
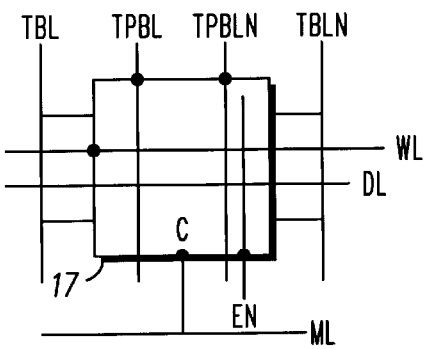
FIG. 3 is a macro view of a CAMRAM cell, illustrating various I/O connections of the non-volatile, bistable magnetic tunnel junction memory cell, used in the cache tag array of FIG. 2.

Referring additionally to FIG. 3, a macro view of one tag cell 17 is illustrated, showing the various I/O connections. Each tag cell 17 includes a tag bitline (TBL) and an inverse (not) tag bitline (TBLN), a tag program bitline (TPBL) and an inverse tag program bitline (TPBLN), an enable line (EN), a word line (WL), a digit line (DL), and a match line (ML). In a preferred embodiment, tag cells 17 include a pair of differentially connected, non-volatile, bistable magnetic tunnel junctions similar to those disclosed in a copending United States patent application filed of even date herewith, entitled "Content Addressable Magnetic Random Access Memory", assigned to the same assignee, and included herein by reference.

Figure 4:
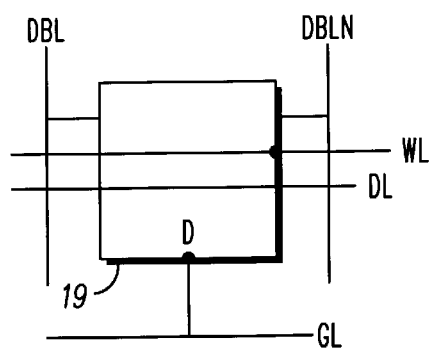
FIG. 4 is a macro view of a data cell, illustrating various I/O connections of the non-volatile, bistable magnetic tunnel junction memory cell, used in the cache data array of FIG. 2.
Figure 5:
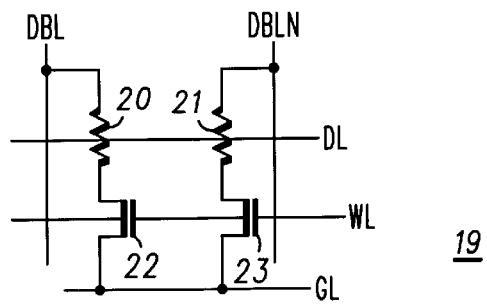
FIG. 5 is a schematic diagram of the bistable magnetic tunnel junction memory cell of FIG. 4.

Referring additionally to FIGS. 4 and 5, a macro view and a schematic view, respectively, of one data cell 19 are illustrated. In the preferred embodiment, each data cell 19 includes a differential pair of non-volatile, bistable magnetic tunnel junctions 20 and 21 and a pair of switching transistors 22 and 23. Each magnetic tunnel junction 20 and 21 is connected to a separate one of switching transistors 22 and 23, and an associated word line WL is connected to activate switching transistors 22 and 23. A digit line DL and word line WL are both magnetically coupled to each magnetic tunnel junction 20 and 21.

Here it should be noted that digit line DL and word line WL of each row of data cells 19 are the same digit line DL and word line WL associated with the corresponding row of tag cells 17. Series connected magnetic tunnel junction 20 and switching transistor 22 are connected between a common or ground line GL and a data bitline DBL. Series connected magnetic tunnel junction 21 and switching transistor 23 are connected between ground line GL and an inverse data bitline DBLN. Thus, magnetic tunnel junctions 20 and 21 operate differentially and they are charged or loaded with differential signals, as will become apparent presently.

It will be understood by those skilled in the art that bitlines are generally associated with columns of an array of memory cells and digit lines are associated with rows of the array. The bitlines and digit lines are used to address individual cells in the array for both reading and programming or storing information in the array. As will be understood by those skilled in the art columns and rows can be easily interchanged and it is intended in this disclosure that such terms be interchangeable. Also, specific names of the various lines, e.g., bitline, word line, digit line, select line, etc. are intended to be generic names used only to facilitate the explanation and are not intended in any way to limit the invention.

Referring again to FIG. 2, it can be seen that a pair of current source/sink circuits 24 are connected to opposite ends of each TPBL and TPBLN line in cache tag array 16 and to opposite ends of each DBL and DBLN line in cache data array 18. A mask register 30 is connected to receive input signals and supply masking signals to cache tag array 16, so that only user defined bits of a tag word in cache tag array 16 participate in an interrogate or search mode of operation. Input signals are also supplied to an argument register 32 for comparing by columns (interrogating or searching) an input word or command to words and commands stored in cache tag array 16. A tag register and current sink 34 is connected by row, to the rows of cache tag array 16. A match register 36, row mux circuit 37, and row current source 38 are connected by row, to the rows of cache data array 18 and cache tag array 16. Also, a row decoder 39 and controller 40 are connected to row mux circuit 37 for the operation thereof. A clock generator 42 provides three phases ($phi_0$, $phi_1$, and $phi_2$) of timing or clock signals to the various circuits. Differential amplifiers $TQ_0$ through $TQ_n$ provide output signals from each row of tag cells 17 in cache tag array 16. Also, differential amplifiers $DQ_0$ through $DQ_n$ provide output signals from each row of data cells 19 in cache data array 18.

Cache memory 15 has three general modes of operation: an interrogate (search) and read mode; a random access read mode; and a random access program mode. The operation of cache memory 15 in each of these modes of operation is described briefly below.

In the interrogate mode, a CPU address or tag is loaded into argument register 32 on clock generator phase $phi_1$. Simultaneously, upon loading, all TBL and TBLN lines are driven to their logic levels. At the same time all match lines $ML_0$ through $ML_n$ are pre-discharged to ground. During $phi_1$, mask register 30 masks all tag cells 17 in cache tag array 16, which effectively disables all tag cells so that there is no contention for match lines.

Once $phi_1$ goes low, all tag cells 17 are enabled. Simultaneously, $phi_2$ goes high on the falling edge of $phi_1$. On the rising edge of $phi_2$, masking data ($Yk_0$ through $Yk_n$) are loaded into mask register 30 and mask register 30 starts to drive the enable EN lines and search and match detection starts. Depending upon masking data $Yk_0$ through $Yk_n$ some of tag cells 17 in cache tag array 16 will be disabled.(i.e., the masking feature). If there is a match, the match line $ML_0$ through $ML_n$ for the matching row remains at ground, but the match lines for mismatching rows are pulled to a logic high. Only unmasked cells which are not disabled participate in the match detection process by pulling the match line high or leaving it at ground potential.

In the search mode after the match detection process is complete, a read cycle is started to read the data in data array 18 corresponding to the tag which was detected in tag array 16, that is the tag which matched with the tag or address from the CPU. Once the read cycle starts, the signal R goes high and the $phi_0$ clock signal is generated on the rising edge of R. During $phi_0$, the TBL and TBLN lines are precharged to Vdd via PC blocks 42 (see FIG. 2) and all tag cells 17 are disabled, i.e. cache tag array 16 is disabled and current consumption of cache tag array 16 is zero. Even though cache tag array 16 is disabled and match lines are not driven by cache tag array 16, the match line data is latched. Also, during $phi_0$ differential amplifiers $DQ_0$ through $DQ_n$ pre-bias DBL and DBLN lines, making necessary initializations to read the bits in cache data array 18. Data cells 19 in cache data array 18 are twin cells for the purpose of fast differential operation. Since this is a cache memory, high speed readout of data after interrogation is a must, i.e. a very fast data memory is needed. Generally, cache data array 18 can be based on any twin cell architecture, but the disclosed twin cell is preferred.

The read process during a search mode is as follows. In the search mode $S=R=1$ and $W=W_{RPLC}=0$. If the output of one stage of match register 36 remains a 1, then RFLG stays a 1 as well, implying there has been a match. If all outputs of match register 36 go to zero, a no match is implied. During the search mode, the row decode control logic will disable row decode 39 and row mux 37 is entirely controlled by $MB_0$ to $MB_n$ outputs of match register 36. Once a match is detected, and $S=R=1$ and $W=W_{RPLC}=0$, the read process begins and one row is activated and current source 38 drives a corresponding wordline/digitline high. Furthermore, upon entering the read process, all ground lines $GL_0$ through $GL_n$ in cache tag array 16 and cache data array 18 are connected to ground via ground switches in tag register and current sink 34. Subsequently, differential amplifiers $DQ_0$ through $DQ_n$ will use the data on the wordline and output a signal. During this time, differential amplifiers $TQ_0$ through $TQ_n$ are disabled.

If no match was found between the input CPU address in argument register 32 and the data stored in cache tag array 16, outputs of all stages of match register 36 will go to zero. Since all outputs of the stages of match register 36 are ORed in match register 36, if they are all low match register 36 creates a low RFLG signal that indicates no match. The low RFLG signal is sent to the CPU which, upon sensing a low RFLG signal, sets $W_{RPLC}$ equal to one, reads the necessary data from the main memory, and sends the same data back to cache memory 15 to replace some existing data in cache memory 15. During this time row decoder 39 is still disabled and control of row mux 37 is supplied by $RPLC_0$ through $RPLC_n$ outputs of an LRU unit (to be explained presently) in match register 36.

In the random access read mode of operation, the entire cache memory 15 is placed in the read mode and read in one access by setting $R=1$ and $W=W_{RPLC}=S=0$. In this mode, control of row mux 37 is supplied by row decode 39 and ground lines $GL_0$ through $GL_n$ are connected to ground via ground switches in tag register and current sink 34. In the read mode, all tag cells 17 are enabled (no masking). This is accomplished via mask register 30. Also, mask register 30 will not accept new data ($YK_0$ through $YK_n$) from the CPU. The output of all mask register stages are initially held and latched low during $phi_0$. Also, during $phi_0$ TBL and TBLN lines are precharged to Vdd. Once $phi_0$ goes low, all tag cells 17 are enabled and the regenerative action of tag cells 17 along the active wordline will either pull TBL to ground or leave it at Vdd, with the opposite action occurring on TBLN. The TBL and TBLN data are sensed differentially by differential amplifiers $TQ_0$ through $TQ_n$ and output signals are generated at their output terminals.

Simultaneously, the same active wordline activates a row of data cells 19 in cache data array 18. Differential data on data lines DBL and DBLN are sensed by differential amplifiers $DQ_0$ through $DQ_n$. The sensing circuitry of differential amplifiers $DQ_0$ through $DQ_n$ is disabled during $phi_0$, at which time pre-biasing takes place as a preparation for sensing once $phi_0$ goes low again. Initially, differential amplifiers $DQ_0$ through $DQ_n$ are enabled via the signal $R=1$. Also, during this mode the wordline current path to ground through the current sink in tag register and current sink 34 is severed, and argument register 32 outputs are tristated (i.e. outputs $A_0$ through $A_n$ are effectively disconnected).

In the random access program mode of operation, the entire cache memory 15 can be programmed in a random fashion as desired. Control of the wordlines is given to row decoder 39 and a wordline is selected via row mux 37. Current is directed from row current source 38 through row mux 37 into a selected digitline and through the current sink in tag register and current sink 34 to ground. All tag cells 17 are disabled via mask register 30 and the outputs of argument register 32 are tristated. Bi-directional current sources 24 source and sink current through the TPBL and TPBLN lines in cache tag array 16 and the DBL and DBLN lines in the cache data array 18, depending on the polarity of input data in both the cache tag array 16 and cache data array 18. Ground switches are turned off so that all ground lines $GL_0$ through $GL_n$ currents are cutoff during the program mode. Also, differential amplifiers $TQ_0$ through $TQ_n$ and $DQ_0$ through $DQ_n$ are disabled.

Figure 6:
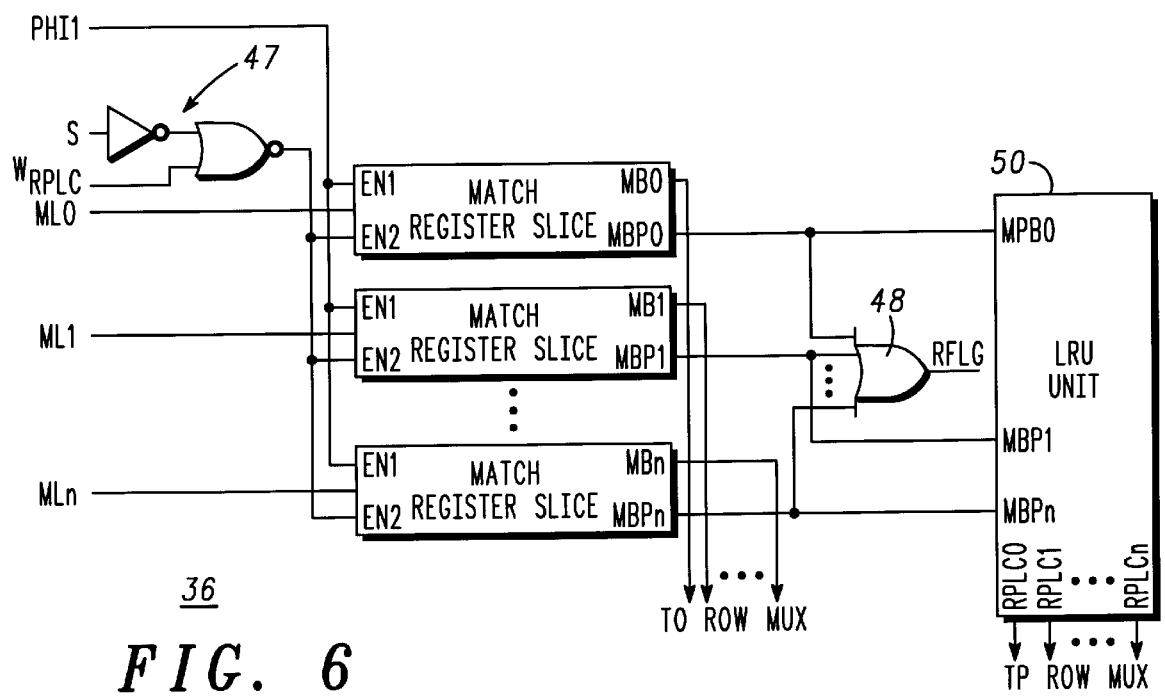
FIG. 6 is a simplified block diagram of the match register of FIG. 2.

Turning now to FIG. 6, a simplified block diagram of match register 36 (see FIG. 2) is illustrated. Match register 36 includes n stages or slices each connected to receive a match signal $ML_0$ through $ML_n$ from a row 0 through n, respectively, of tag cells 17 in cache tag array 16. A timing signal $phi_1$ provides a first enable signal $EN_1$ to each of the n stages during a search mode. Timing signal $phi_1$ is generated via clock generator 42 on the rising edge of S, to initialize match lines $ML_0$ through $ML_n$ to ground level. A second logic circuit 47 is connected to receive search signal S or a write replace signal $W_{RPLC}$ and to provide a second enable signal $EN_2$ to each of the n stages during a search or replace mode. Each of the n stages supplies a match signal $MB_0$ through $MB_n$, respectively, to row mux 37. Also, each of the n stages supplies a match signal $MBP_0$ through $MBP_n$, respectively, to an OR circuit 48 and to a Least Recently Used (LRU) unit 50. OR circuit 48 supplies a replace flag (RFLG) signal to the CPU and LRU unit 50 supplies replace signals $RPLC_0$ through $RPLC_n$ to row mux 37.

During the search mode in cache tag array 16, initially all match lines $ML_0$ through $ML_n$, are at ground potential. This results in all $MB_0$ through $MB_n$ outputs from match register 36 being a logic one, or high, which selects all wordlines/digitlines $DL_0$ through $DL_n$ in row mux 37. At this time when all digit lines $DL_0$ through $DL_n$ are selected, all digitlines $DL_0$ through $DL_n$ get initialized to ground potential by $phi_1$.

Match detection is performed and, once match detection is complete the following process is performed. If there is a match, all match lines $ML_0$ through $ML_n$ go to a logic one (or high), except the match line having the corresponding match, which will stay at logic zero (or ground). As a result, all $MB_0$ through $MB_n$ outputs from match register 36 will go to a logic zero (or ground) except the one corresponding to the match, which will stay high. Therefore, all digit lines $DL_0$ through $DL_n$ get "deselected" except the one, which remains selected. At this point, since there was a match, a read command is issued and non-volatile magnetic cache memory 15 enters the read process, at which time row current source/driver 38 turns on and pulls the selected word line high, after which the read process continues as described above.

If there is no match, all match lines $ML_0$ through $ML_n$ will go to one (logic high), with no exceptions, and $MB_0$ through $MB_n$ outputs will be a logic low, giving the control of row mux 37 to LRU unit 50. In this condition, LRU unit 50 controls row mux 37 via $RPLC_0$ through $RPLC_n$ signals. Once all $MB_0$ through $MB_n$ outputs go low, all digit lines $DL_0$ through $DL_n$ are deselected until LRU unit 50 drives one of $RPLC_0$ through $RPLC_n$ to a logic high. Once one of the $RPLC_0$ through $RPLC_n$ goes to a logic high, a corresponding wordline/digitline is selected, and the CPU places non-volatile magnetic cache memory 15 in the program mode (W=1), which causes row current source/driver 38 to turn on and source digit line program current into the selected wordline/digitline. Thus, the selected row of cache tag array cells 17 in cache tag array 16 is programmed.

As long as there is a match, one of the outputs $MBP_0$ through $MBP_n$ will be high and as a result, RFLG=1, indicating to the CPU that a match has been found. If there is no match, all of the outputs $MBP_0$ through $MBP_n$ will be low and RFLG=0, indicating to the CPU that no match was found. When no match is found, the CPU sends a logic high write replace signal, $W_{RPLC}$, back to non-volatile magnetic cache memory 15 for a write back.

Figure 7:
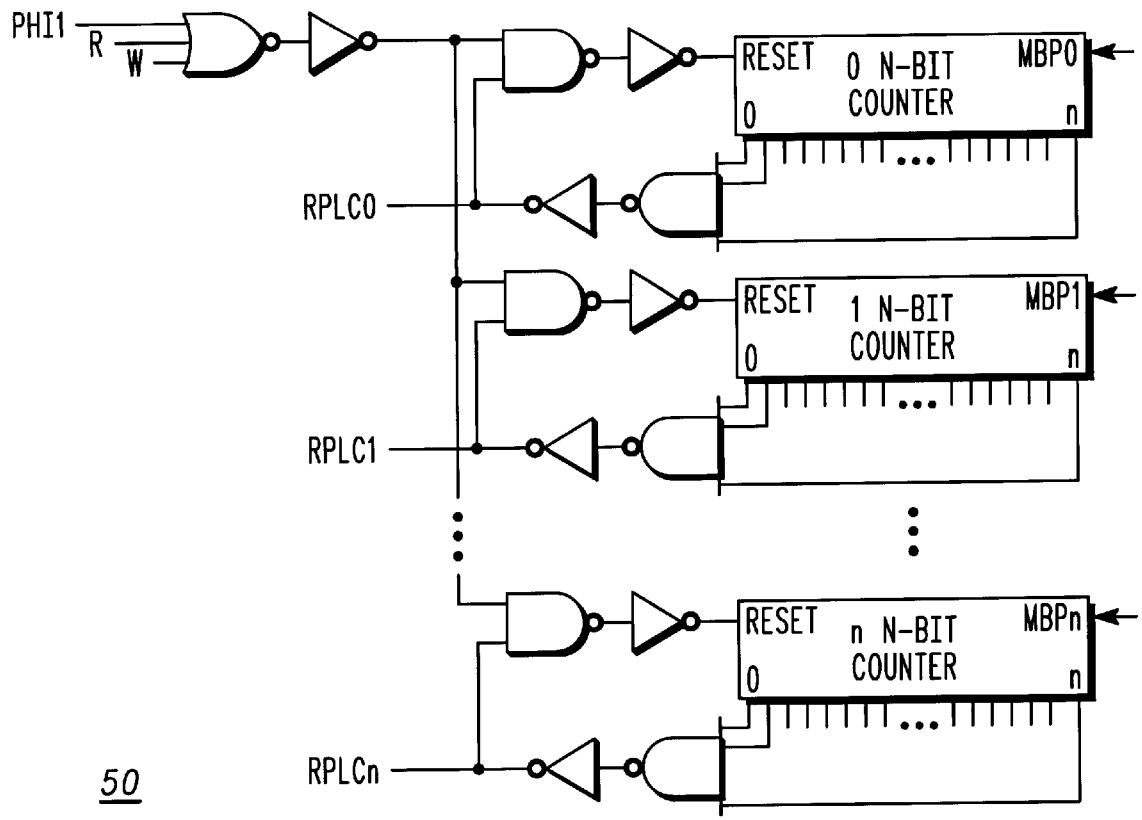
FIG. 7 is a simplified block diagram of the LRU unit of FIG. 6.

Referring additionally to FIG. 7, LRU unit 50 includes n n-bit counter, designated 0 n-bit counter through n n-bit counter, where each counter counts from 0 to $2^n-1$, for each of the match inputs $MBP_0$ through $MBP_n$. Each counter is incremented one decimal unit when the attached one of the match inputs $MBP_0$ through $MBP_n$ goes to 0 from 1 in every cycle. The first counter to reach $2^n-1$ will output a corresponding replace signal $RPLC_0$ through $RPLC_n$ to row mux 37 which will activate the selected digit line $DL_0$ through $DL_n$ to allow current to flow from row current source 38 through the selected row of data cells 19 and tag cells 17 to the current sink in tag register and current sink 34. If more than one counter reaches the count of $2^n-1$ simultaneously, the first counter closest to either the most significant bit (MSB) or the least significant bit (LSB), depending upon a preselected preference, is allowed to activate its associated DL and WL. Once any n-bit counter reaches the final count where one of $RPLC_0$ to $RPLC_n$ go to one, in the following search cycle that n-bit counter will be reset to zero. If a read signal is entered during the search mode as a result of a match or the start of a random read or program operation, once again the n-bit counter in which the final count was reached will be reset. In this operation tag register 34 can be accessed by the CPU to deactivate any row (word) and prevent the replacement of the selected row or word.

Figure 8:
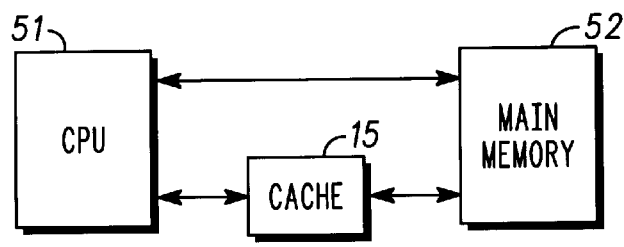
FIG. 8 is a simplified block diagram of a computer incorporating the cache memory of FIG. 2.

Referring to FIG. 8, a simplified block diagram is illustrated of cache memory 15 connected to a CPU 51 and a main memory 52. As explained briefly above, when CPU 51 needs to access memory, cache memory 15 is interrogated first. The idea behind cache memory 15 is to keep the most frequently accessed instructions and data in the fast cache memory 15. The most important characteristic of cache memory 15 is that it has super-fast access time because of the novel CAMRAM cells used (see the copending United States Patent Application entitled "Content Addressable Magnetic Random Access Memory" referenced above). Therefore, extremely small time, or no time at all, is spent when searching for a word in cache memory 15.

If the word is found in cache memory 15, it is read from a fast memory portion of cache memory 15. If the word is not found in cache memory 15, the slower main memory 52 is accessed to read the word. A block of words, associated with the word just accessed from main memory 52, is then transferred from main memory 52 to cache memory 15. The block site could be one or several words adjacent to the word just accessed. In this way, some data is transferred to cache memory 15 so that future references to cache memory 15 can find the required word or words in cache memory 15. The average memory access time of CPU 51 is improved by the use of cache memory 15. If the hit time of CPU 51 is high enough, the average access time will approach the access time of cache memory 15.

Thus, a non-volatile, bistable magnetic tunnel junction cache memory is disclosed. The non-volatile cache memory can be used to dynamically change the contents of the cache memory to tailor the stored information to a specific application or program. For example, if a typical CPU code is made up of a large number of instructions, then statistically the most frequently used instructions can be extracted and programmed into the cache memory, Also, the non-volatile cache memory is preloaded once and from that point on every time the system or chip is powered off the stored data is retained, and the non-volatile cache memory is ready for fast operation without a need for cache initialization from latency. Further, since the nonvolatile cache memory can be powered down without loss of memory or need for initialization, during inactivity the non-volatile cache memory can be completely powered down to save a tremendous amount of current consumption.

The present novel cache memory uses "associative mapping" which is the most flexible and fastest method of mapping physical address-to-memory data or mapping of data in the main memory-to-fast cache. Associative mapping allows any location in the cache memory to store any word from the main memory. The present novel cache memory stores both the address, known as the tag or tag word, and the content of the memory word, known as the data or data word. Further, the tag and data are stored in a common row of memory cells using a common digit line and a common word line, which greatly simplifies the entire cache memory and the operation. The cache memory is searched by comparing a selected tag to the tags stored in the rows of the cache tag array and the word line in the row of the cache tag array of a matching stored tag and the corresponding row in the data array is activated to automatically read-out data stored in the corresponding row in the data array. This process greatly simplifies and speeds-up the search and read process.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A non-volatile, bistable magnetic tunnel junction cache memory comprising:
   a cache tag array of non-volatile magnetic memory tag cells arranged in rows and columns, each row of the tag array including a word line and a digit line associated with each tag cell in the row; and
   a cache data array of non-volatile magnetic memory data cells arranged in rows and columns, the rows of the data array corresponding with the rows of the tag array and each row of the data array being magnetically associated with the word line and the digit line associated with each corresponding row of the tag array.

2. A non-volatile, bistable magnetic tunnel junction cache memory as claimed in claim 1 wherein each tag cell includes a differentially connected pair of magnetic tunnel junctions.

3. A non-volatile, bistable magnetic tunnel junction cache memory as claimed in claim 1 wherein each data cell includes a differential pair of magnetic tunnel junctions.

4. A non-volatile, bistable magnetic tunnel junction cache memory as claimed in claim 3 wherein each column of the data array includes a pair of differential data bitlines associated with each data cell in the column.

5. A non-volatile, bistable magnetic tunnel junction cache memory as claimed in claim 1 wherein each tag cell in the cache tag array and each data cell in the cache data array includes first and second magnetic tunnel junctions each formed with two layers of magnetic material separated by a tunnel barrier layer, one of the two layers of magnetic material including a substantially pinned magnetic vector and the other of the two layers of magnetic material including a magnetic vector that is free to move into and out of alignment with the pinned magnetic vector.

6. A non-volatile, bistable magnetic tunnel junction cache memory as claimed in claim 5 wherein the cache tag array and the cache data array are fabricated on a common semiconductor substrate.

7. A non-volatile, bistable magnetic tunnel junction cache memory as claimed in claim 1 further including apparatus coupled to one of the cache tag array and the cache data array for sensing a match of a stored tag and providing replacement indications for any stored tags that are not matched.

8. A non-volatile, bistable magnetic tunnel junction cache memory as claimed in claim 7 wherein the apparatus coupled to one of the cache tag array and the cache data array further includes circuitry for counting matches of stored tags and providing a replacement indication of a tag having a lowest number of matches.

9. A non-volatile, bistable magnetic tunnel junction cache memory as claimed in claim 8 wherein the apparatus coupled to one of the cache tag array and the cache data array further includes circuitry for writing replacement data in the tag having the lowest number of matches.

10. A non-volatile, bistable magnetic tunnel junction cache memory as claimed in claim 1 further including circuitry coupled to the cache tag array, the data array, and the word lines, the circuitry being constructed to activate the word line in the row of the cache tag array of a matching stored tag and the corresponding row in the data array to read-out data stored in the corresponding row in the data array.

11. A non-volatile, bistable magnetic tunnel junction cache memory comprising:
a cache tag array of non-volatile magnetic memory tag cells arranged in rows and columns, each row of the tag array including a word line and a digit line associated with each tag cell in the row, each tag cell including:
a differentially connected pair of magnetic tunnel junctions; and
programming and detection circuitry connected to the differentially connected pair and including differential bitlines, differential program bitlines, an enable line, the word line, and the digit line; and
a cache data array of non-volatile magnetic memory data cells arranged in rows and columns, each column of the data array including a pair of differential data bitlines associated with each data cell in the column, each row of the data array being associated with the word line and the digit line associated with each row of tag cells in the tag cell array, and each data cell including:
a differential pair of magnetic tunnel junctions positioned adjacent the junction of a unique row and a unique column, the differential pair of magnetic tunnel junctions being differentially connected to the differential data bitlines associated with the unique column; and
each tunnel junction of the differential pair of magnetic tunnel junctions being positioned magnetically adjacent the word line and the digit line associated with the unique row.

12. A non-volatile, bistable magnetic tunnel junction ache memory as claimed in claim 11 wherein each data cell includes two switching transistors, each tunnel junction of the differential pair of magnetic tunnel junctions being connected to a separate one of the two switching transistors, and the associated word line being connected to activate the two switching transistors.

13. A non-volatile, bistable magnetic tunnel junction cache memory as claimed in claim 11 further including apparatus coupled to one of the cache tag array and the cache data array for sensing a match of a stored tag and providing replacement indications for any stored tags that are not matched.

14. A non-volatile, bistable magnetic tunnel junction cache memory as claimed in claim 13 wherein the apparatus coupled to one of the cache tag array and the cache data array further includes circuitry for counting matches of stored tags and providing a replacement indication of a tag having a lowest number of matches.

15. A non-volatile, bistable magnetic tunnel junction cache memory as claimed in claim 14 wherein the apparatus coupled to one of the cache tag array and the cache data array further includes circuitry for writing replacement data in the tag having the lowest number of matches.

16. A non-volatile, bistable magnetic tunnel junction ache memory as claimed in claim 11 wherein each tag cell in the cache tag array and each data cell in the cache data array includes first and second magnetic tunnel junctions each formed with two layers of magnetic material separated by a tunnel barrier layer, one of the two layers of magnetic material including a substantially pinned magnetic vector and the other of the two layers of magnetic material including a magnetic vector that is free to move into and out of alignment with the pinned magnetic vector.

17. A non-volatile, bistable magnetic tunnel junction cache memory as claimed in claim 16 wherein the cache tag array and the cache data array are fabricated on a common semiconductor substrate.

18. A non-volatile, bistable magnetic tunnel junction cache memory as claimed in claim 11 further including circuitry coupled to the cache tag array, the data array, and the word lines, the circuitry being constructed to activate the word line in the row of the cache tag array of a matching stored tag and the corresponding row in the data array to automatically read-out data stored in the corresponding row in the data array.

19. A non-volatile, bistable magnetic tunnel junction cache memory comprising:
a cache tag array of non-volatile magnetic memory tag cells arranged in rows and columns, each tag cell including a differentially connected pair of magnetic tunnel junctions;
each row of the tag array including a word line and a digit line associated with each tag cell in the row;

each column of the cache tag array including a differential pair of tag bitlines and a differential pair of tag programming bitlines coupled to each tag cell in the column;

a cache data array of non-volatile magnetic memory data cells arranged in rows and columns, each data cell including a differential pair of magnetic tunnel junctions;

the rows of the cache data array corresponding with the rows of the cache tag array and each row of the cache data array being magnetically associated with the word line and the digit line associated with each corresponding row of the cache tag array; and each column of the cache data array including a differential pair of data bitlines coupled to each data cell in the column.

20. A non-volatile, bistable magnetic tunnel junction cache memory as claimed in claim 19 wherein the differentially connected pair of magnetic tunnel junctions in each tag cell and the differential pair of magnetic tunnel junctions in each data cell are each formed with two layers of magnetic material separated by a tunnel barrier layer, one of the two layers of magnetic material including a substantially pinned magnetic vector and the other of the two layers of magnetic material including a magnetic vector that is free to move into and out of alignment with the pinned magnetic vector.

21. A non-volatile, bistable magnetic tunnel junction cache memory as claimed in claim 20 wherein the cache tag array and the cache data array are fabricated on a common semiconductor substrate.

22. A non-volatile, bistable magnetic tunnel junction cache memory as claimed in claim 19 further including apparatus coupled to one of the cache tag array and the cache data array for sensing a match of a stored tag and providing replacement indications for any stored tags that are not matched.

23. A non-volatile, bistable magnetic tunnel junction cache memory as claimed in claim 22 wherein the apparatus coupled to one of the cache tag array and the cache data array further includes circuitry for counting matches of stored tags and providing a replacement indication of a tag having a lowest number of matches.

24. A non-volatile, bistable magnetic tunnel junction cache memory as claimed in claim 23 wherein the apparatus coupled to one of the cache tag array and the cache data array further includes circuitry for writing replacement data in the tag having the lowest number of matches.

25. A non-volatile, bistable magnetic tunnel junction cache memory as claimed in claim 19 further including circuitry coupled to the cache tag array, the data array, and the word lines, the circuitry being constructed to activate the word line in the row of the cache tag array of a matching stored tag and the corresponding row in the data array to read-out data stored in the corresponding row in the data array.

26. A non-volatile, bistable magnetic tunnel junction cache memory comprising:

a cache tag array of tag cells arranged in rows and columns, each row of the tag array including a word line and a digit line associated with each tag cell in the row; and a cache data array of data cells arranged in rows and columns, the rows of the data array corresponding with the rows of the tag array and each row of the data array being associated with the word line and the digit line associated with each corresponding row of the tag array.

27. A non-volatile, bistable magnetic tunnel junction cache memory as claimed in claim 26 wherein the tag cells each include a differentially connected pair of magnetic tunnel junctions.

28. A non-volatile, bistable magnetic tunnel junction cache memory as claimed in claim 26 wherein the data cells each include a differential pair of magnetic tunnel junctions.

29. A non-volatile, bistable magnetic tunnel junction cache memory as claimed in claim 26 further including circuitry coupled to the cache tag array, the data array, and the word lines, the circuitry being constructed to activate the word line in the row of the cache tag array of a matching stored tag and the corresponding row in the data array to automatically read-out data stored in the corresponding row in the data array.

30. A method of searching and reading a non-volatile, bistable magnetic tunnel junction cache memory comprising the steps of:

providing a cache tag array of tag cells arranged in rows and columns, each row of the tag array including a word line and a digit line associated with each tag cell in the row, and a cache data array of data cells arranged in rows and columns, the rows of the data array corresponding with the rows of the tag array and each row of the data array being associated with the word line and the digit line associated with each corresponding row of the tag array;

storing tags in the rows of the cache tag array and storing corresponding data in the corresponding rows of the data array;

searching the cache memory by comparing a selected tag to the tags stored in the rows of the cache tag array; and activating the word line in the row of the cache tag array of a matching stored tag and the corresponding row in the data array to automatically read-out data stored in the corresponding row in the data array.

31. A method of programming data in a non-volatile, bistable magnetic tunnel junction cache memory comprising the steps of:

providing a cache tag array of tag cells arranged in rows and columns, each row of the tag array including a word line and a digit line associated with each tag cell in the row, and a cache data array of data cells arranged in rows and columns, the rows of the data array corresponding with the rows of the tag array and each row of the data array being associated with the word line and the digit line associated with each corresponding row of the tag array;

storing tags in the rows of the cache tag array and storing corresponding data in the corresponding rows of the data array;

searching the cache memory by comparing selected tags to the tags stored in the rows of the cache tag array;

sensing matches of stored tags and stored tags that are not matched;

counting the number of times the tag stored in each row of the tag array is not matched and selecting a row of the cache tag array having a stored tag with a highest number of not matches; and storing a new tag in the selected row of the cache tag array and storing corresponding data in the corresponding row of the data array.

* * * * *

UNITED STATES PATENT AND TRADEMARK OFFICE
CERTIFICATE OF CORRECTION

PATENT NO.  : 6,452,823 B1
DATED       : September 17, 2002
INVENTOR(S) : Naji

It is certified that error appears in the above-identified patent and that said Letters Patent is hereby corrected as shown below:

<u>Column 1,</u>
Line 3, after the title, please add as a new first paragraph the following paragraph:
-- This invention was made with Government support under Agreement No. MDA972-96-3-0016 awarded by DARPA. The Government has certain rights in the invention. --

Signed and Sealed this

Twenty-first Day of October, 2003

JAMES E. ROGAN
*Director of the United States Patent and Trademark Office*